United States Patent [19]

Nakajima et al.

[11] Patent Number: 4,760,291
[45] Date of Patent: Jul. 26, 1988

[54] SYNCHRONOUS BUS TYPE SEMICONDUCTOR CIRCUIT WHEREIN TWO CONTROL SIGNALS SHARE COMMON TERMINAL

[75] Inventors: Toyokatsu Nakajima; Tatsuo Yamada, both of Itami, Japan

[73] Assignee: Mitsubishi Denki Kabushiki Kaisha, Tokyo, Japan

[21] Appl. No.: 54,851

[22] Filed: May 27, 1987

[30] Foreign Application Priority Data

May 30, 1986 [JP] Japan .................. 61-125996

[51] Int. Cl.⁴ .................. H03K 19/00; H03K 5/00; H03K 5/13; H03K 5/159
[52] U.S. Cl. .................. 307/480; 307/262; 307/470; 307/265; 307/601; 307/606; 328/99; 328/55
[58] Field of Search .............. 307/601, 603, 606, 590, 307/591, 597, 265, 470, 364, 480, 481; 328/55, 58, 99, 56

[56] References Cited

U.S. PATENT DOCUMENTS

| | | | |
|---|---|---|---|
| 3,471,790 | 10/1969 | Kaps | 328/58 |
| 4,317,053 | 2/1982 | Shaw et al. | 307/480 |
| 4,691,121 | 9/1987 | Theus | 307/480 |
| 4,719,371 | 1/1988 | Fujita et al. | 307/265 |

FOREIGN PATENT DOCUMENTS 2607000 8/1977 Fed. Rep. of Germany.

OTHER PUBLICATIONS

Intel, Component Data Catalog, 1982, 9-333.
Motorola Inc., 8-Bit Microprocessor & Peripheral Data; DL 133; 3-307, 309.

Primary Examiner—Stanley D. Miller
Assistant Examiner—Trong Q. Phan
Attorney, Agent, or Firm—Saidman, Sterne, Kessler & Goldstein

[57] ABSTRACT

A semiconductor IC device of an asynchronous bus type which is in a selected state when a chip select signal applied to it is at a "H" level, comprises an external control signal line through which an external control signal is input, and a first and a second internal control signal lines for transfer of a first and a second control signals each of which is not activated when the other is activated. The first control signal is allocated to either the "H" level or the "L" level of the external control signal, and the second control signal is activated when the external control line is at the second level which is the inverse of the first level for the first control signal. An inhibit circuit is provided to prevent the second control signal from being erroneously activated while the first control signal is to be activated and when the first level of the external control signal begins after or terminates before the chip select signal.

4 Claims, 3 Drawing Sheets

SYNCHRONOUS BUS TYPE SEMICONDUCTOR CIRCUIT WHEREIN TWO CONTROL SIGNALS SHARE COMMON TERMINAL

BACKGROUND OF THE INVENTION

The present invention relates to a semiconductor IC (integrated circuit) device of an asynchronous bus type and particularly to an improvement for reducing the number of terminals by use of an arrangement in which a terminal is shared by two types of control signals.

When it is desired that two types of control signals are allotted to or transmitted by a common terminal or pin, a circuit as shown in FIG. 1 may be contemplated. As illustrated, the contemplated circuit comprises AND gates 7 and 8 and an inverter 10, to which a chip select signal CS and a control signal A/$\overline{B}$ which represents a combination of control signals A and B, are supplied.

FIG. 2 shows operation of the circuit of FIG. 1. An internal control signal A' on an internal control signal line 4 can be activated if a chip select terminal 1 and a control terminal 2 are both at "H". But if the chip select signal CS on the chip select terminal 1 is longer that the period t1 of the combined control signal A/$\overline{B}$ on the control terminal 2, there occurs an error (undesirable "H" level) in an internal control signal B' on an internal control signal line 3, for the periods t2 and t3. This error is fatal in that the internal control signal B' is made at "H" when it is attempted that only the internal control signal A' be made at "H".

Because of such a problem, it has been impossible to allocate two control signals to a common terminal in a semiconductor IC device of the asynchronous bus type.

SUMMARY OF THE INVENTION

An object of the invention is to enable reduction of the number of terminals of a semiconductor IC device of the asynchronous bus type.

According to the invention, there is provided a semiconductor IC device of an asynchronous bus type which is in a selected state when a chip select signal applied to it is at "H" level, and which comprises an external control signal line through which an external control signal is input, and a first and a second internal control signal lines for transfer of a first and a second control signals each of which is not activated when the other is activated, wherein said first control signal is allocated to a first one of the "H" level and the "L" level of the external control signal, and said second control signal is activated when the external control line is at the second level which is the inverse of the first level for said first control signal, said semiconductor IC device further comprising an inhibit circuit for preventing said second control signal from being erroneously activated while said first control signal is to be activated, and when the first level of said external control signal begins after or terminates before said chip select signal.

DETAILED DESCRIPTION OF THE PREFERRED EMBODIMENTS

Figure 2:
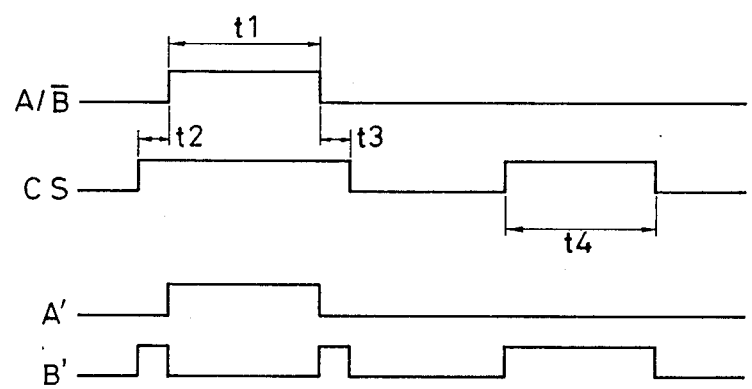
FIG. 2 is a timing chart showing operation of the device of FIG. 1.
Figure 3:
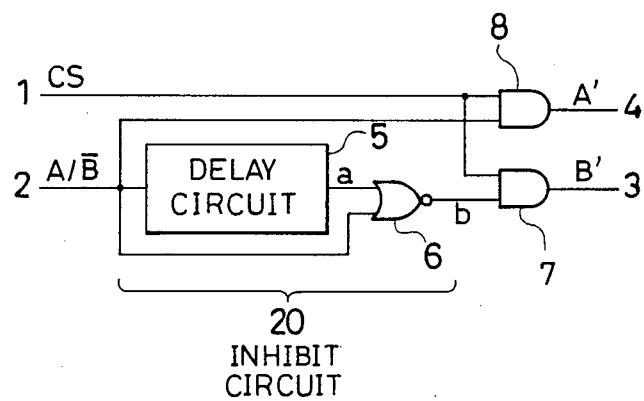
FIG. 3 is a diagram showing a semiconductor IC device of an embodiment of the invention.

An embodiment shown in FIG. 3 includes an arrangement for preventing an erroneous operation at the period t3 in FIG. 2, that is at the termination of the chip select signal CS.

The semiconductor IC device comprises a control terminal 2 through which a control signal A/$\overline{B}$ is input. The control signal A/$\overline{B}$ represents a combination of a control signal A and an inversion of a control signal B.

Application of "H" at the terminal 2 means input of the control signal A, while application of "L" at the terminal 2 means input of the control signal B.

The semiconductor IC device further comprises AND gates 7 and 8 whose output lines constitute control signal lines 4 and 3 on which internal control signals A' and B' are produced. The AND gate 8 receives the chip select signal CS and the control signal A/$\overline{B}$, so the signal A' is a logical product of the signal A/$\overline{B}$ and the chip select signal CS.

The semiconductor IC device further comprises an inhibit circuit 20 which comprises a delay circuit 5 receiving the control signal A/$\overline{B}$ and a NOR gate 6 receiving the output a of the delay circuit 5 and the control signal A/$\overline{B}$.

The AND gate 7 receives the chip select signal CS and the output of the NOR gate 6.

Figure 4:
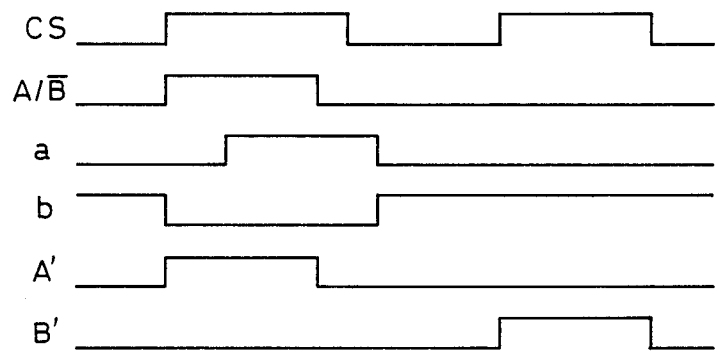
FIG. 4 is a timing chart showing operation of the device of FIG. 3.

The operation of the device will be described with reference to FIG. 4.

When there is a difference in the timing between the chip select signal CS and the control signal A/$\overline{B}$, an error may occur. But according to the illustrated embodiment, the signal A/$\overline{B}$ is passed through the delay circuit 5, and the output a of the delay circuit 5 and the signal A/$\overline{B}$ (without the delay) are input to the NOR gate 6, whose output b is then input to the AND gate 7 together with the chip select signal CS. The erroneous pulse at t3 in FIG. 2 is thereby rejected or eliminated. The delay time of the delay circuit can be determined on consideration of the maximum difference which can occur in the chip select signal CS of the system and the pulse width of the control signal A/$\overline{B}$.

Figure 5:
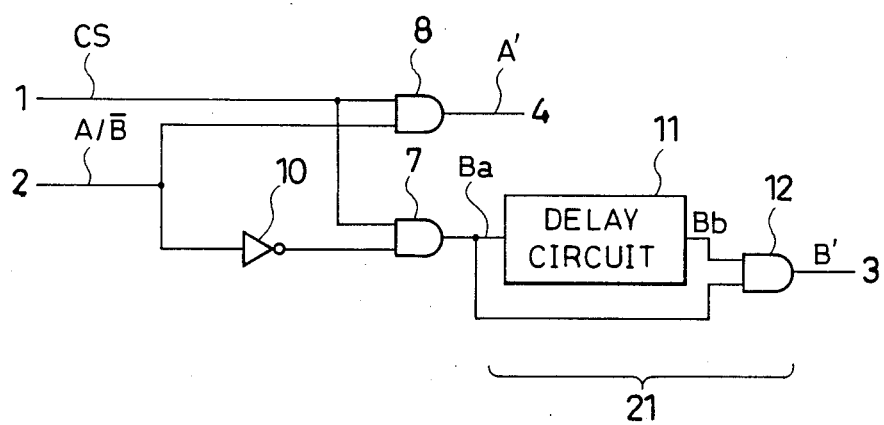
FIG. 5 is a diagram showing a semiconductor IC device of a second embodiment of the invention.

FIG. 5 shows another embodiment of the invention. This embodiment includes an arrangement for preventing an erroneous operation at the periods t2 and t3, that is at the beginning and the termination of the chip select signal CS.

Figure 1:
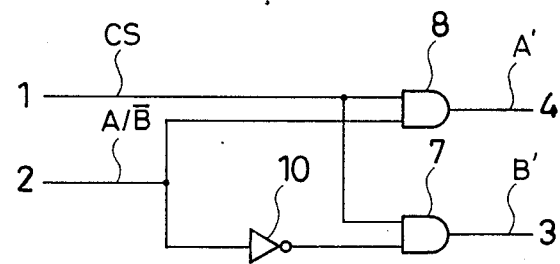
FIG. 1 is a diagram showing semiconductor IC device which may be contemplated.

The circuitry includes a portion identical to that of FIG. 1. But the output of the AND gate 7 is denoted by Ba, rather than B'. In addition, there are provided a delay circuit 11 receiving the signal Ba and an AND gate 12 receiving an output Bb of the delay circuit 11 and the output Ba of the AND gate 7. The output of the AND gate 7 constitutes the second control signal B'. In this embodiment, the delay circuit 11 and the AND gate 12 forms an inhibit circuit 21 which rejects a control signal of a pulsewidth smaller than a predetermined time length.

Figure 6:
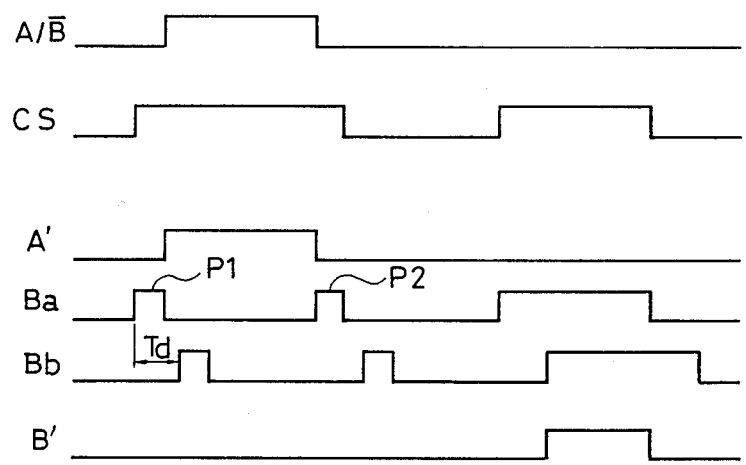
FIG. 6 is a timing chart showing operation of the device of FIG. 5.

FIG. 6 shows operation of the circuit of FIG. 5. The signals A/B̄, CS and A' are identical to those of the same notations in FIG. 2. The signal Ba is identical to the signal B' in FIG. 2. The signal Bb is delayed by the delay time Td of the delay circuit 11 with respect to the signal Ba. The signal B' is the logical product of Ba and Bb. It is seen that pulses P1 and P2 at the output of the AND gate 7, having a pulsewidth smaller than Td are removed or rejected, and do not appear at the output of the AND gate 12.

The delay time Td of the delay circuit 11 is so determined as to be larger than the deviation in the timing of the leading and trailing edges of the chip select signal CS which must be allowed.

As has been described, according to the present invention, the number of pins of a semiconductor IC device of the asynchronous bus type can be reduced and the production cost can therefore be reduced. Alternatively, the pin that has been saved can be used for other purposes. This will increase the performance of the semiconductor IC device.

What is claimed is:

1. A semiconductor IC device of an asynchronous bus type which is selected by a chip select signal, and which comprises
    an external control signal line through which an external control signal is input, and
    a first and a second internal control signal line for transfer of a first and a second control signal each of which is not activated when the other is activated,
    wherein said first control signal is allocated to a first one of the "H" level and the "L" level of the external control signal, and said second control signal is activated when the external control line is at the second level which is the inverse of the first level for said first control signal,
    said semiconductor IC device further comprising an inhibit circuit for preventing said second control signal from being erroneously activated while said first control signal is to be activated, and when the first level of said external control signal begins after or terminates before said chip select signal.

2. A device according to claim 1, further comprising an AND gate for receiving the chip select signal and the external control signal, the output of said AND gate constituting said first control signal.

3. A device according to claim 2, wherein said inhibit circuit comprises
    a delay circuit receiving said external control signal and producing a delayed signal, and
    a NOR gate receiving the external control signal and the delayed signal and producing an inverse of a logical sum of the two input signals, and
    said device further comprises a second AND gate receiving the chip select signal and the output of the NOR gate, the output of the second AND gate constituting said second control signal.

4. A device according to claim 2, further comprising an inverter receiving the external control signal, and
    a second AND gate receiving the output of the inverter and the chip select signal,
    wherein said inhibit circuit comprises
    a delay circuit receiving the output of the second AND gate, and
    a third AND gate receiving the output of the delay circuit and the output of the second AND gate, the output of the third AND gate constituting said second control signal.

* * * * *